United States Patent
Mitsushima et al.

(10) Patent No.: US 6,216,336 B1
(45) Date of Patent: Apr. 17, 2001

(54) ELECTRONIC COMPONENT MOUNTING DEVICE

(75) Inventors: Takatoshi Mitsushima, Nara; Kunio Tanaka; Takashi Munezane, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/142,868

(22) PCT Filed: Jan. 16, 1998

(86) PCT No.: PCT/JP98/00151

§ 371 Date: Sep. 17, 1998

§ 102(e) Date: Sep. 17, 1998

(87) PCT Pub. No.: WO98/32317

PCT Pub. Date: Jul. 23, 1998

(30) Foreign Application Priority Data

Jan. 17, 1997 (JP) .................................................. 9-006013

(51) Int. Cl.$^7$ .................................................. H05K 3/30
(52) U.S. Cl. .................................. 29/740; 29/721; 29/741; 29/743
(58) Field of Search .............................. 29/740, 739, 832, 29/743, 721, 741; 226/115, 157; 242/594.3, 564.4

(56) References Cited

U.S. PATENT DOCUMENTS

| | | | |
|---|---|---|---|
| 661,114 | * 10/1900 | Williams | 242/594.3 |
| 4,670,976 | * 6/1987 | Stridsberg | 29/740 |
| 4,794,689 | * 1/1989 | Seno et al. | 29/740 |
| 4,951,383 | * 8/1990 | Amao et al. | 29/721 |
| 5,135,601 | * 8/1992 | Klose et al. | 156/406.4 |
| 5,235,739 | * 8/1993 | Pedall | 29/740 |
| 5,294,035 | * 3/1994 | Asai et al. | 226/157 |
| 5,323,528 | * 6/1994 | Baker | 29/721 |
| 5,390,872 | * 2/1995 | Cipolla et al. | 242/348.4 |
| 5,419,802 | * 5/1995 | Nakatsuka et al. | 156/584 |
| 5,553,809 | * 9/1996 | Oku | 242/563.1 |
| 5,628,107 | * 5/1997 | Nushiyama et al. | 29/740 |
| 5,784,777 | * 7/1998 | Asai et al. | 29/832 |
| 5,809,639 | * 9/1998 | Alvite | 29/740 |
| 5,840,594 | * 11/1998 | Tsubouchi et al. | 438/15 |
| 5,855,059 | * 1/1999 | Togami et al. | 29/740 |
| 5,860,208 | * 1/1999 | Nomura | 29/740 |
| 5,873,691 | * 2/1999 | Asai et al. | 414/416 |
| 5,894,657 | * 4/1999 | Kanayama et al. | 29/740 |

FOREIGN PATENT DOCUMENTS

| | | |
|---|---|---|
| 61-204700 | 11/1986 | (JP) . |
| 1-317000 | 12/1989 | (JP) . |
| 3-70199 | 3/1991 | (JP) . |
| 08191199 | 7/1996 | (JP) . |

* cited by examiner

Primary Examiner—Carl J. Arbes
Assistant Examiner—Minh Trinh
(74) Attorney, Agent, or Firm—Israel Gopstein

(57) ABSTRACT

The present invention relates to an electronic parts mounting device designed to mount chip type electronic parts on a printed board. It is an object of the invention to provide a compact and high-speed electronic parts mounting device.

To achieve this object, the present invention provides first and second drive systems (12) and (13) for driving first and second supplying portions (2) and (3) arranged on both sides of a table portion (6) and has arrangement pitches of suction nozzles (18) of each supplying portion, each of the drive systems (12) and (13), and each cassette (4) of the supplying portions identical with each other. This structure provides the compact and high-speed electronic parts mounting device.

5 Claims, 10 Drawing Sheets

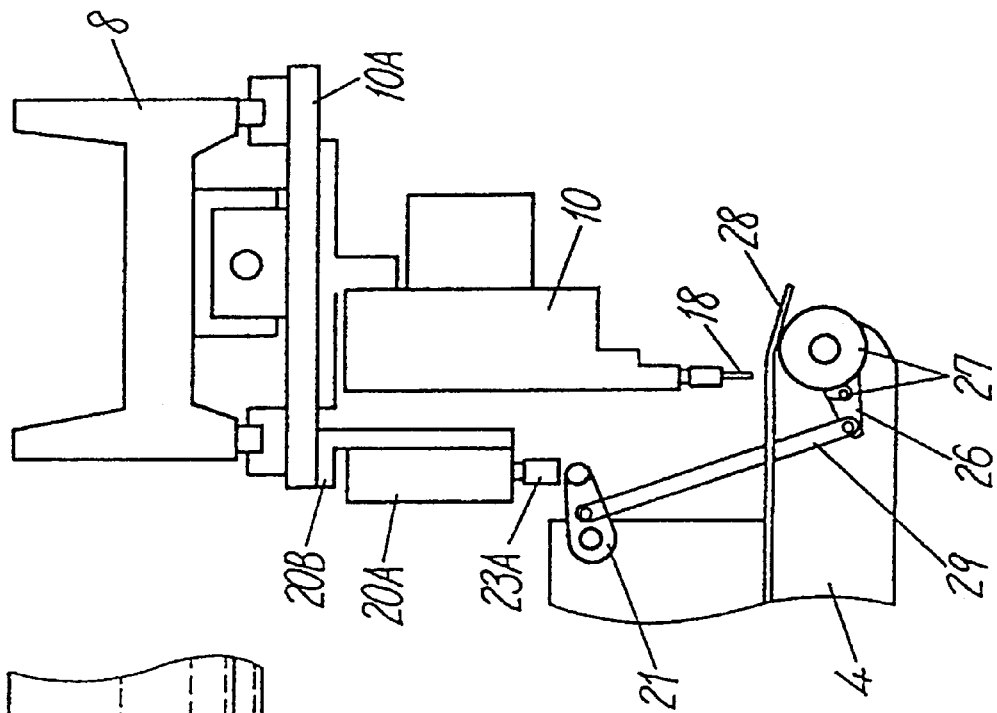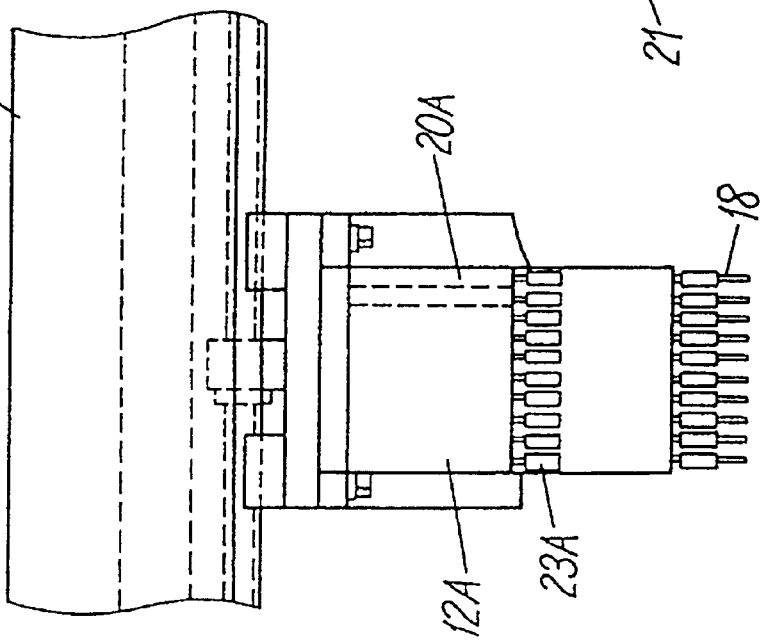

ELECTRONIC COMPONENT MOUNTING DEVICE

FIELD OF TECHNIQUE

The present invention relates generally to an electronic parts mounting device used in mounting on a printed board surface mountable chip type electronic parts employed in a variety of electronic equipment.

BACKGROUND ART

Conventionally, such electronic parts mounting devices are roughly classified into general purpose mounting devices using robots and high-speed mounting devices with a rotary mounting portion. As one of the robot type general purpose mounting devices, what is disclosed in Japanese Patent First Publication No. 6-85492 is known which includes, as shown in FIG. 9, an electronic parts supplying portion 70 having disposed thereon cassettes 77 designed to supply taped electronic parts in sequence, a substrate holding portion 79 holding a printed board 75, a mount head portion 72 having an electronic parts suction nozzle 71 installed slidably to mount electronic parts on the printed board 75, a first drive shaft 73 having the mount head portion 72 installed slidably, and a second drive shaft 74 driving the first drive shaft 73 in a direction perpendicular to the first drive shaft 73 and which is so designed that the mount head portion 72 moves in XY directions to suck the electronic parts, one by one, supplied, in sequence, from the electronic parts supplying portion 70 to mount them on the printed board 75.

As one of the rotary type high-speed mounting devices, what is disclosed in Japanese Patent First Publication No. 7-202491 is known which includes, as shown in a major portion perspective view of FIG. 10, a rotary head 81 which has a plurality of suck nozzles 82 arranged in a circumferential portion thereof and which turns intermittently, a parts supplying portion 80 on an X-Y table 83 movable to a stop position of the suck nozzles 82, a recognition portion 86 recognizing electronic parts sucked by the suck nozzles 82, and the X-Y table 83 movable in two perpendicular directions while holding the printed board 85 on which electronic parts are to be mounted. The disclosed mounting device is designed to suck, recognize, and mount the electronic parts through intermittent rotation of the rotary head 81.

There is an increasing need for small-sized, low-priced, and high-speed electronic parts mounting devices. The robot type general purpose mounting device having the above described conventional structure is compact and simple in structure, but has the drawback in that a high-speed operation cannot be achieved because the electronic parts are sucked one by one and then mounted on the printed board 75. Additionally, the rotary type high-speed mounting device is fast in mounting tact because of a high-speed operation of the rotary head 81, but has the disadvantages that an ultra high-speed operation is not achieved because it has a structure which sucks the electronic parts one by one and that facilities are bulky and the price of the facilities is high. Electronic mounting devices of the type intermediate between the both devices as described above are, thus, expected to be realized.

DISCLOSURE OF THE INVENTION

It is, accordingly, an object of the present invention to provide an electronic parts mounting device which is capable of solving the above prior art problems and which is compact and achieves a highspeed operation.

To achieve this object, the electronic parts mounting device of the invention has a compact structure wherein a plurality of suck nozzles and a plurality of cassettes supplying electronic parts in sequence are arranged at the same pitches, and drive mechanisms for driving the cassettes arranged at the same pitches are provided one for each of the cassettes and achieves a high-speed operation.

BRIEF DESCRIPTION OF THE DRAWINGS

FIG. 8(a) is a major portion front view of an electronic parts mounting device according to the second embodiment of the invention.

FIG. 8(b) is a major portion side view of the electronic parts mounting device.

BEST MODE FOR CARRYING OUT THE INVENTION

One embodiment of the present invention will be described below using FIGS. 1 to 7.

Figure 1:
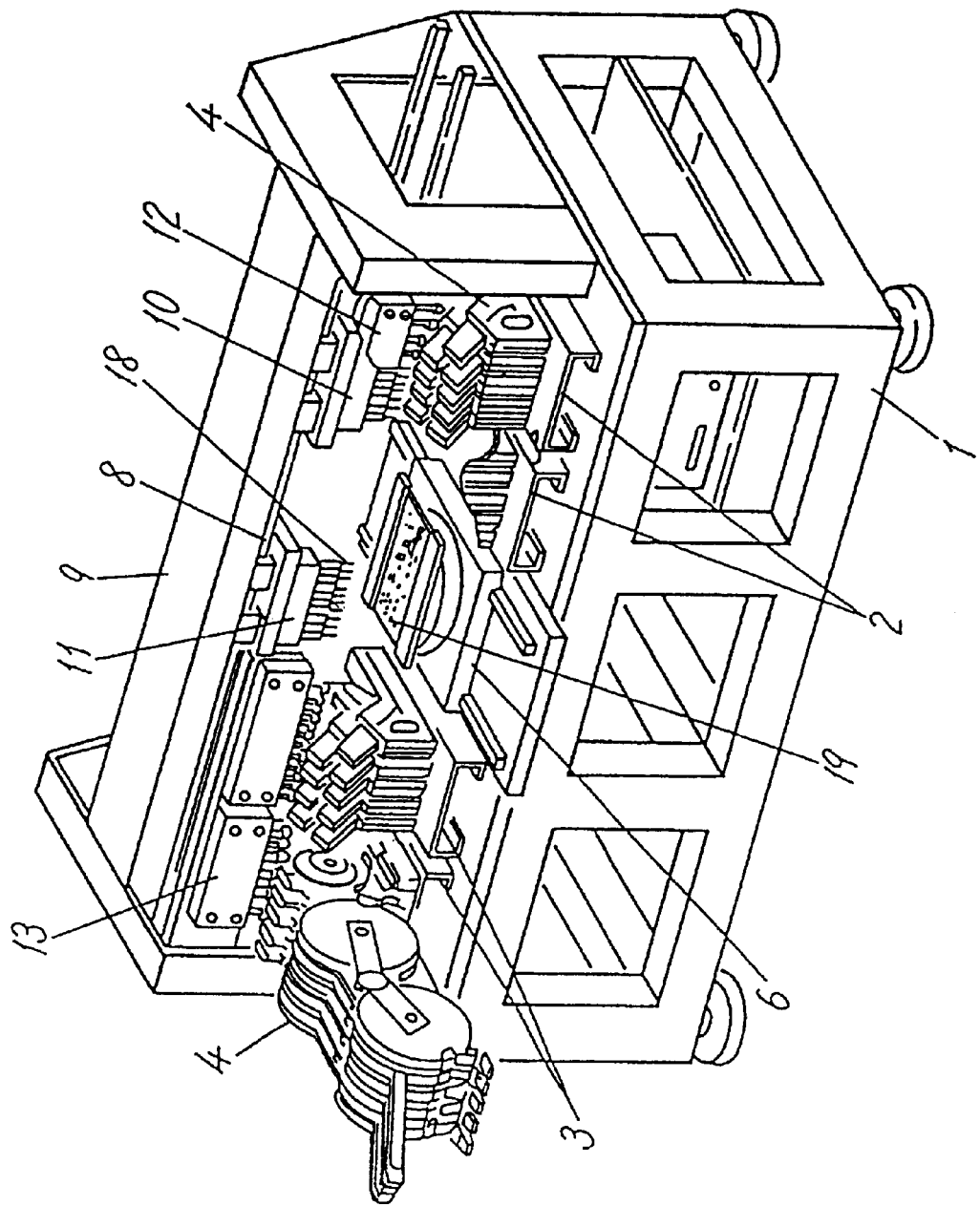
FIG. 1 is a perspective view which shows an electronic parts mounting device according to the first embodiment of the invention.
Figure 2:
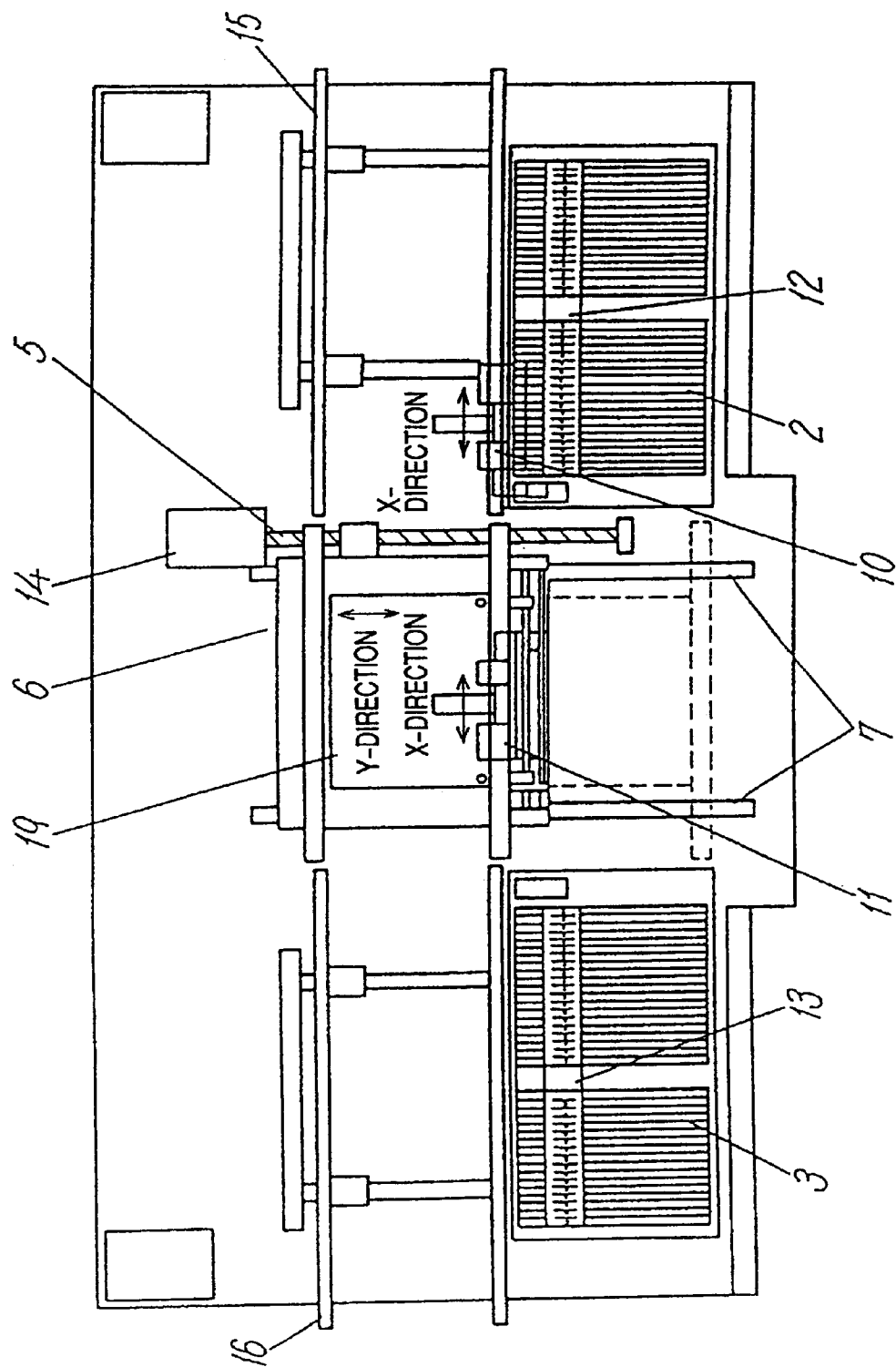
FIG. 2 is a plan view of FIG. 1.
Figure 3:
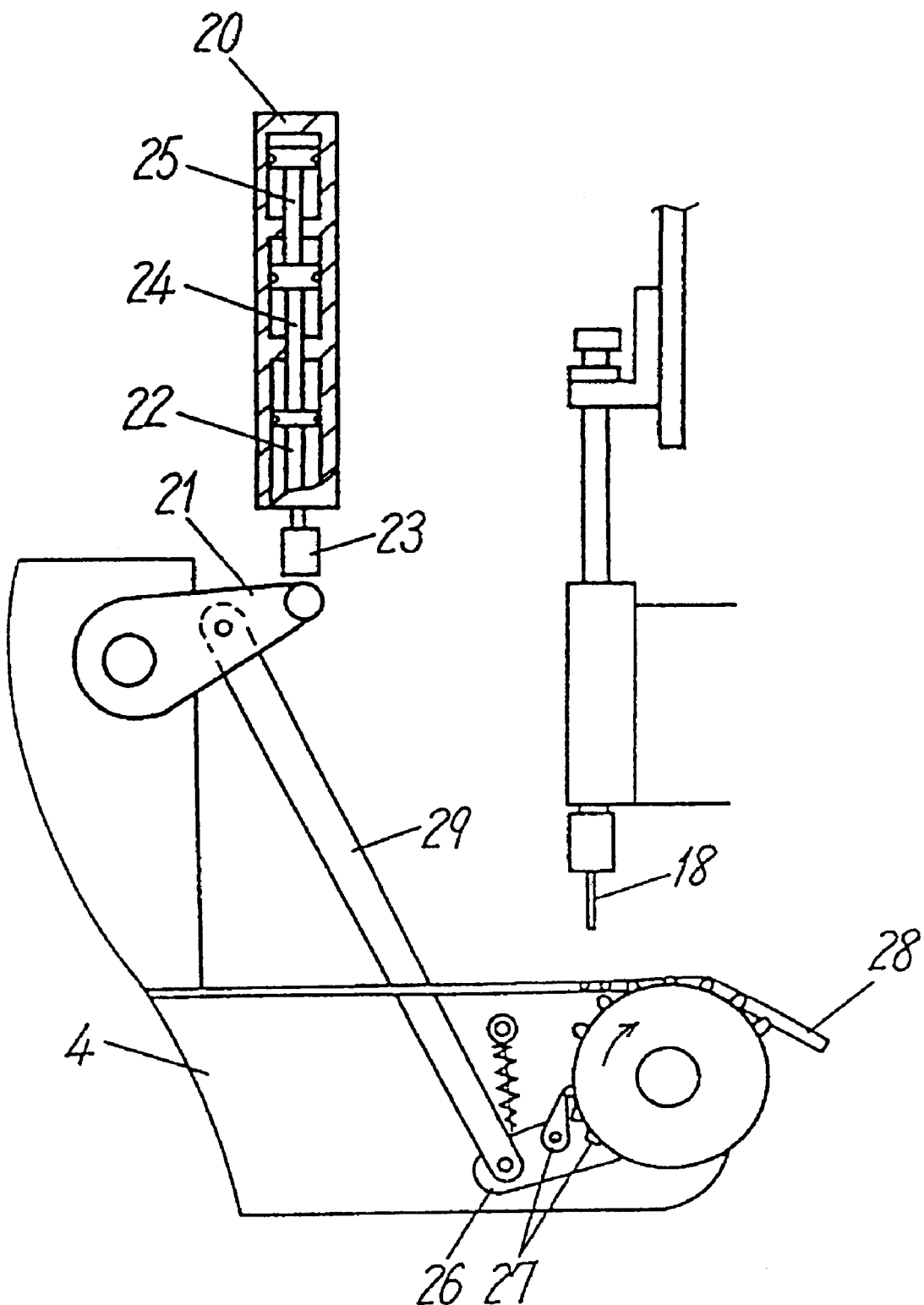
FIG. 3 is a partial cross sectional major portion side view which shows a drive mechanism for the cassette.

(Embodiment 1) In FIGS. 1 and 2, 2 and 3 are first and second supply portions, respectively, each of which has a structure wherein a plurality of cassettes 4 for supplying electronic parts in sequence are disposed adjacent each other on a body 1. The first and second supply portions 2 and 3 are arranged in alignment at a given interval. A table portion 6 is disposed in the above given interval portion intermediate between the first and second supply portions 2 and 3. The table portion 6 is so mounted that it slides by rotation of a drive motor 14 through a ball screw 5 in the same direction as an electronic parts supply direction (Y-direction).

10 and 11 are first and second mounting head portions which hold a plurality of suck nozzles for sucking and holding the electronic parts so that they may be lifted vertically. The first and second mounting head portions 10 and 11 are installed on a guide rail 8 on a lower surface of an upper frame 9 connected to the body 1 so that they may slide independently in a direction (X-direction) perpendicular to the electronic parts supply direction.

15 is a loader portion for transporting the printed board 19 to the table portion 6. 16 is an unloader portion for withdrawing the printed board 19 from the table portion 6. 12 and 13 are first and second drive systems which supply electronic parts in sequence from the cassettes 4 to the suck nozzles 18 of the first and second mounting head portions 10 and 11 and whose arrangement pitches are identical with arrangement pitches of the cassettes 4.

FIG. 3 shows the drive system for the mounting head portion and the cassette. In FIG. 3, 21 is a drive lever installed on the cassette 4. 20 is a cylinder for moving the lever 21 by pushing the lever 21. 23 is a pusher collar mounted on a head of the cylinder 20. The cylinder 20 and the pusher collar 23 are installed in each of the first and second drive systems 12 and 13 for each of the cassettes 4.

29 is a link member connected at an end to the above lever 21. 26 is a tape feed lever connected to the other end of the link 20 member 29. 27 is a feed claw mechanism driven through movement of the tape feed lever 26. 28 are taped electronic parts transported intermittently through the feed claw mechanism 27.

Figure 4:
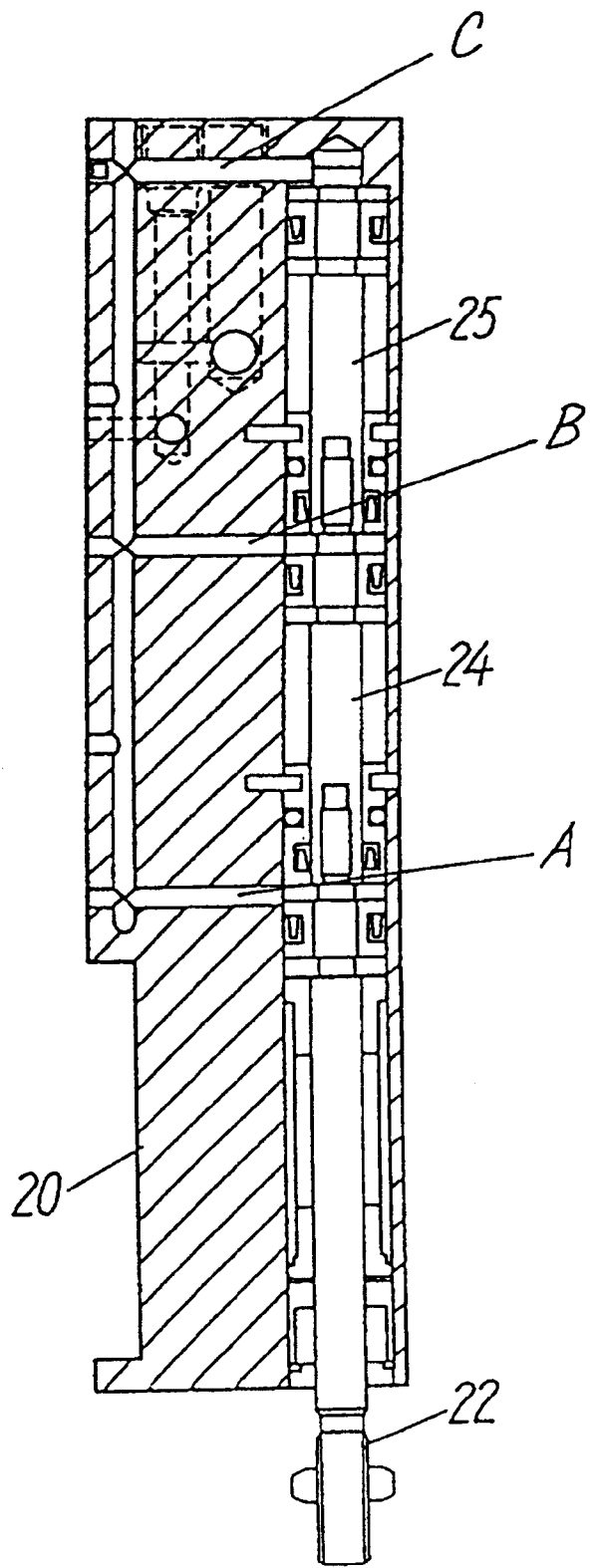
FIG. 4 is a cross sectional view of a cylinder as a drive mechanism for the cassette.

The above cylinder 20 has, as shown in FIG. 4 in detail, a bar-shaped structure wherein a spool 22 is connected at the rear to spools 24 and 25. With this structure, driving forces of the spools 24 and 25 are accumulated and added to a driving force of the spool 22. Specifically, the air pressure is applied to the spools 22, 24, and 25 through air paths A, B, and C, respectively, so that the driving forces of them are added.

The operation of the electronic parts mounting device thus constructed will be explained below.

First, the cylinders 20, as shown in FIG. 3 in detail, installed on the first and second drive systems 12 and 13 are actuated by the first and second drive systems 12 and 13, as shown in FIG. 1 to move the levers 21 for driving the cassettes 4 mounted on the first and second supplying portions 2 and 3.

The movement of the lever 21 causes the taped electronic parts 28 to be transported intermittently to a pickup position (not shown) through the link member 29, the tape feed lever 26, and the feed claw mechanism 27.

Figure 5B:
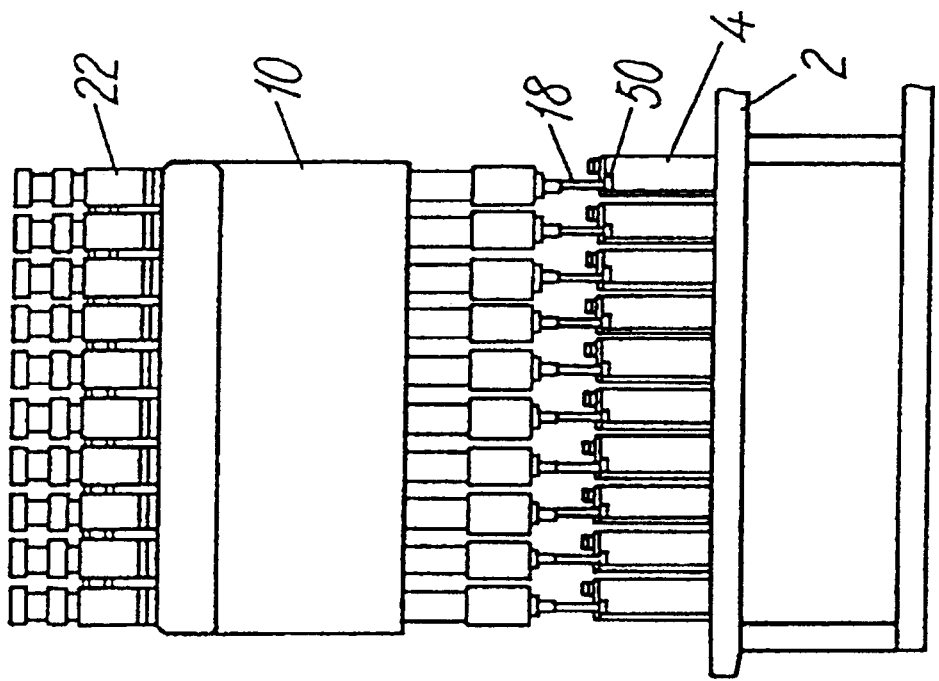
FIGS. 5(a) and 5(b) are major portion front views for explanation of suck operations, respectively.
Figure 5A:
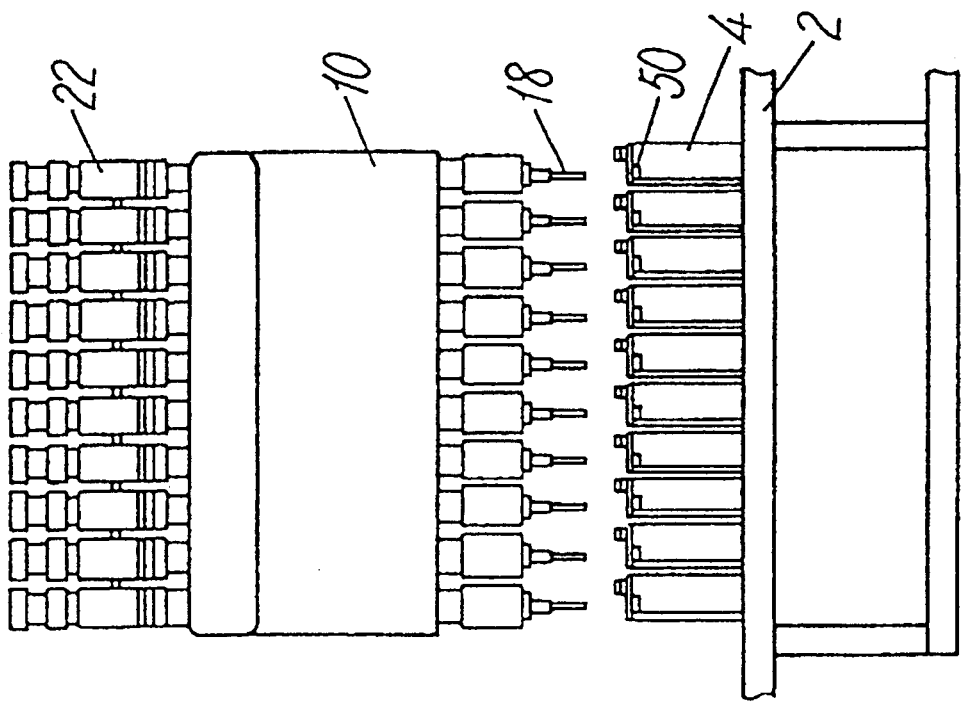
Figure 6:
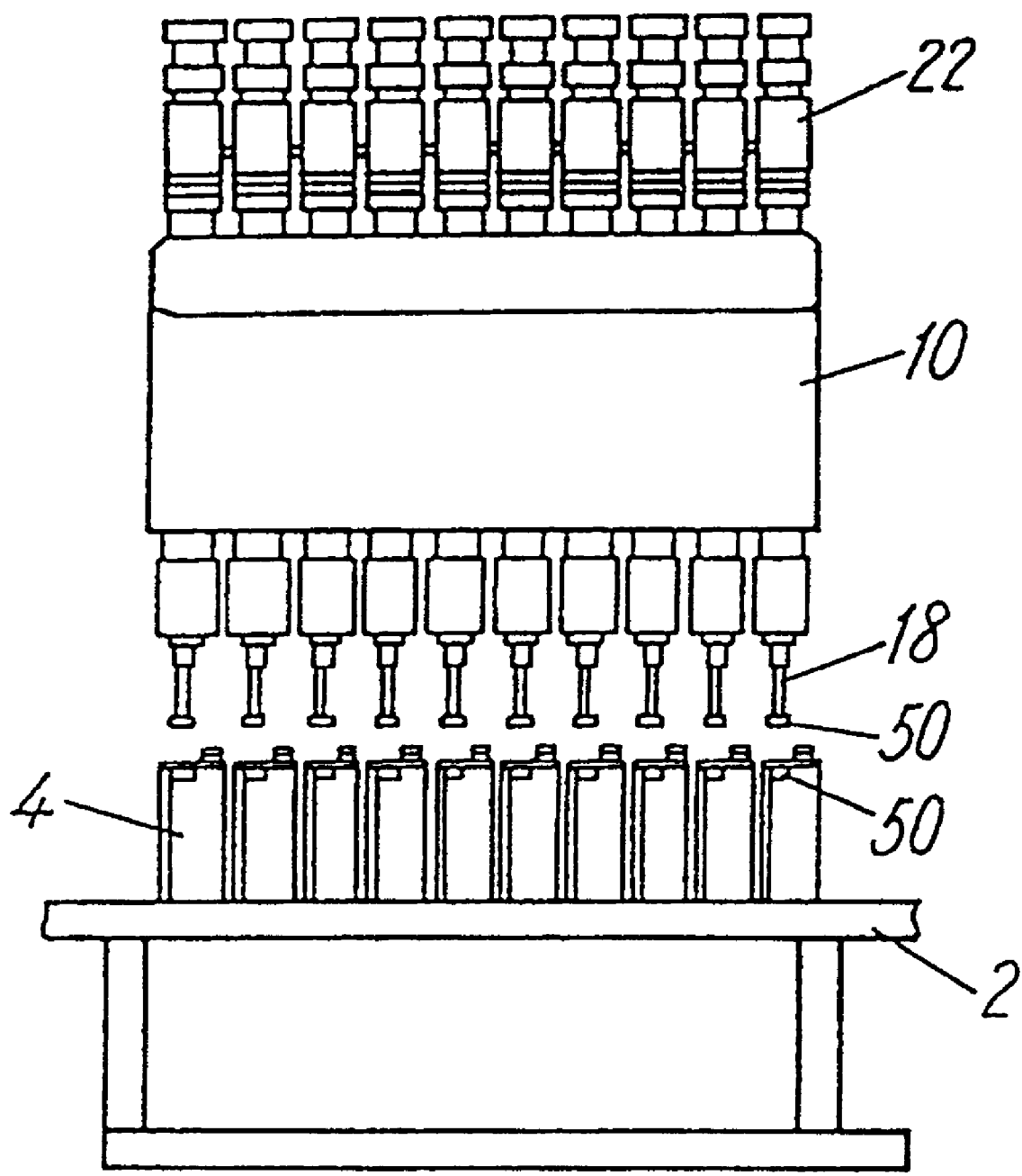
FIG. 6 is a major portion front view which shows sucked conditions.
Figure 7:
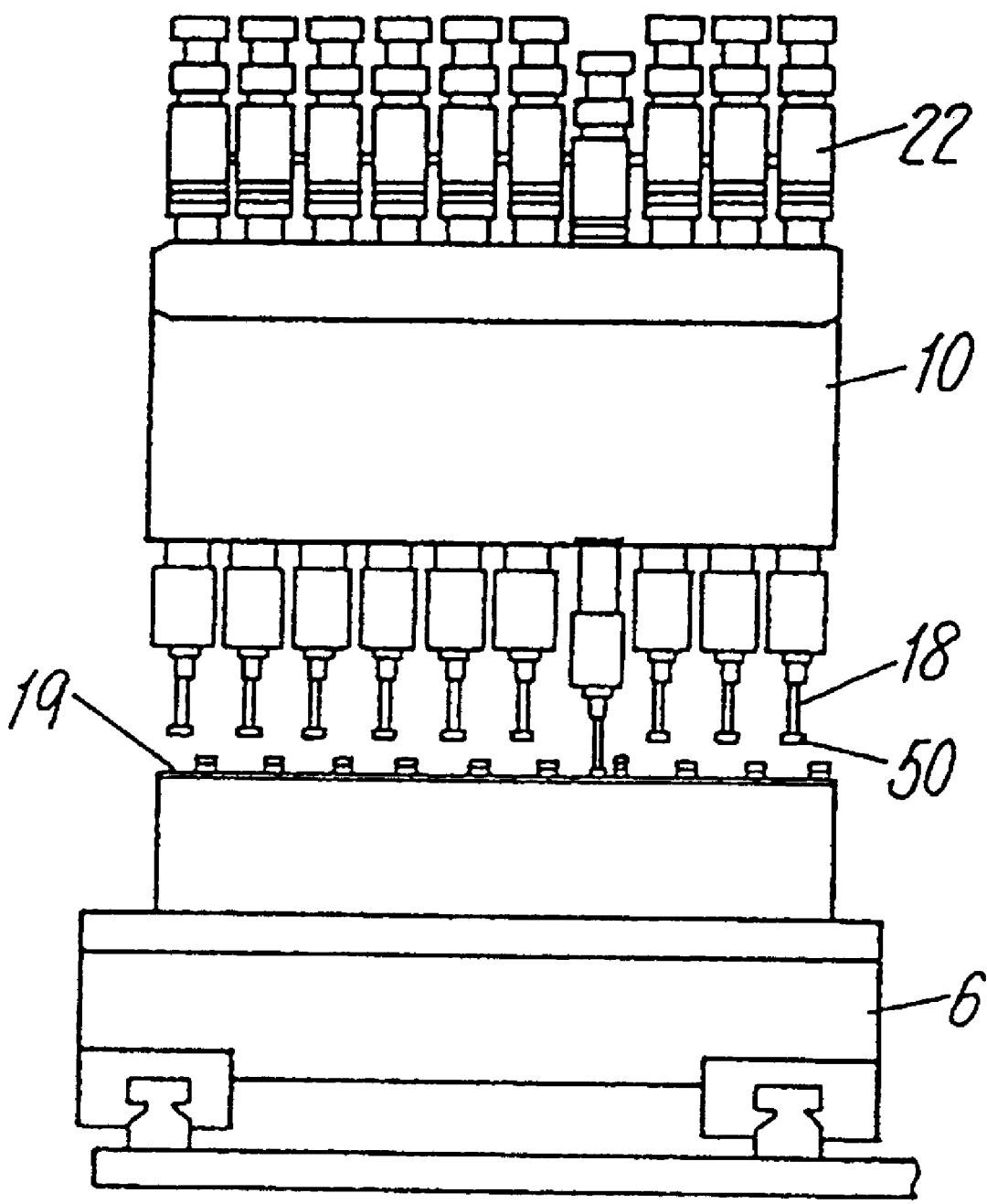
FIG. 7 is a major portion front view which shows mounted conditions.
Figure 9:
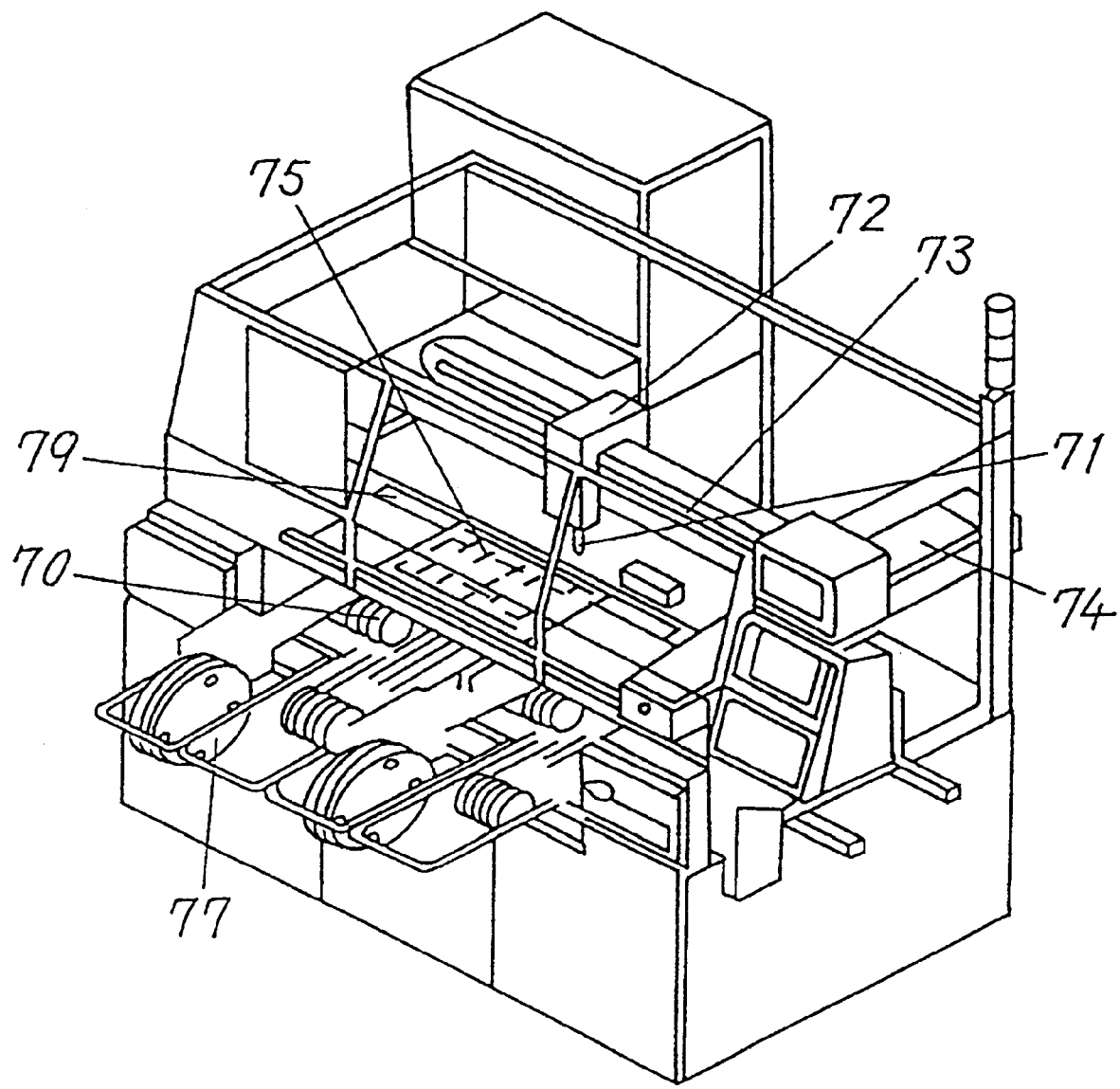
FIG. 9 is a perspective view which shows a conventional general purpose electronic parts mounting device.

Next, the first mounting head portion 10 is, as shown in FIG. 5(a), instructed by a program to move above the first supplying portion 2. The suck nozzles 18 are, as shown in FIG. 5(b), moved downward to suck the electronic parts 50. Subsequently, the suck nozzles 18 of the first mounting head portion 10 sucking the electronic parts 50, as shown in FIG. 6, move upward. Next, positioning (mechanical positioning (not shown) and pattern recognition positioning) is performed. Some of the suck nozzles 18 are selected or all the suck nozzles 18 are actuated at the same time to mount the sucked electronic parts 50 in sequence on the printed board 19 held on the table portion 6 so that all the electronic parts sucked may be mounted on the printed board 19.

The second head mounting portions 11 are designed to move relative to the first mounting head portions 10 to perform a mounting operation when the first mounting head portions 10 perform the mounting operation in the above manner. Specifically, the electronic parts 50 are mounted on the printed board 19 in sequence through alternate operations of the first and second mounting head portions 10 and 11.

As described above, the first mounting head portions 10 suck the electronic parts 50 supplied through the first drive systems 12 from the first supplying portion 2 and mount them on the printed board 19. The arrangement pitches of the suck nozzles 18 held by the first mounting head portions 10, the cassettes 4 arranged on the first supplying portion 2, and the first drive systems 12 for driving the cassettes 4 are identical with each other. The first mounting head portion 10, the cassette 4, and the first drive system 12 are designed to have a paired relationship, thereby allowing the suck nozzles 18 to be moved vertically at the same time to such and mount the electronic parts 50 simultaneously. This eliminates an unnecessary operation, thus achieving high-speed mounting.

The present invention is not limited to the above embodiment and offers a structure capable of being used in rotary type high-speed electronic parts mounting devices.
(Embodiment 2)

The second embodiment of the invention will be explained using FIG. 8.

The operation of suck nozzles of an electronic parts mounting device of this embodiment is identical with that in the first embodiment, and explanation thereof will be omitted here. Only different parts will be explained.

Figure 10:
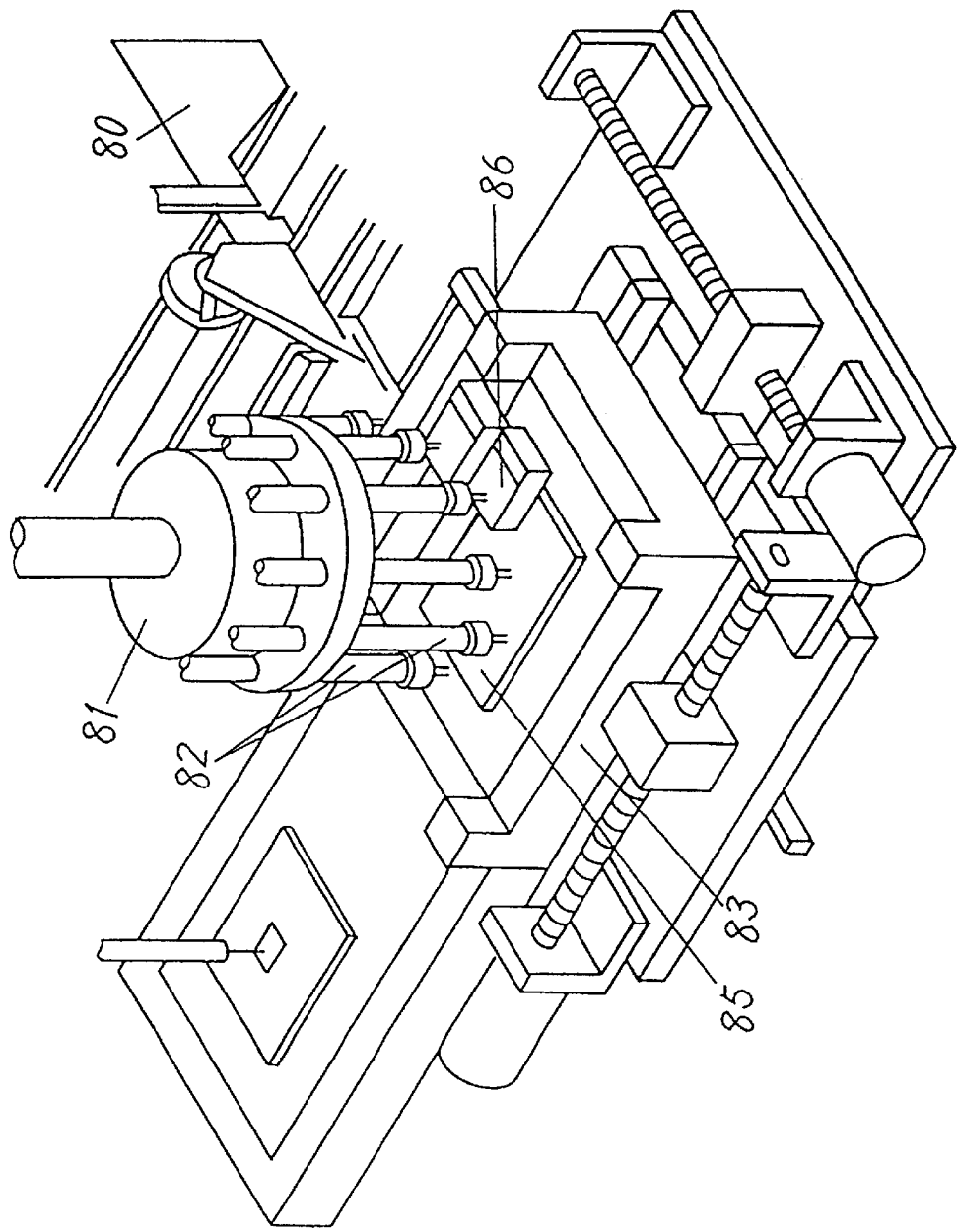
FIG. 10 a major portion perspective view which shows a conventional high-speed electronic parts mounting device.

FIGS. 8(a) and 8(b) are a major portion front view showing vicinities of a mounting head portion of the electronic parts mounting device according to the second embodiment and a side view thereof, respectively. In FIGS. 8, 10 is a first mounting head portion installed slidably on a guide rail 8. 18 are suck nozzles held by the first mounting head portions 10 so that they may be moved vertically. 12A are first drive systems mounted through a mount plate 20B on a base member 10A having disposed thereon the above first mounting head portions 10. 20A are cylinders mounted in the first drive systems 12A. 23A is a pusher collar installed on a head of each of the cylinders 20A.

4 is a cassette. 21 is a lever for driving the cassette 4. 29 is a link member. 26 is a tape feeding lever. 27 is a feed claw mechanism. 28 are taped electronic parts.

The thus constructed electronic parts mounting device of the invention is such that when the first mounting head portions 10 suck electronic parts, the first drive systems 12A mounted on the first mounting head portions 10 move above the cassettes 4 arranged on the first supplying portion 2 together with the first mounting head portions and operate, which minimizes unnecessary operations, thereby achieving a high-speed parts mounting operation. Further, the first drive systems 12A having as many cylinders 20A as the suck nozzles 18 are provided, which allows the drive systems to be decreased by half as compared with the first embodiment. This contributes to compactness and reduction in weight and price.

Possibility of Industrial Utility

As described above, the electronic parts mounting device according to the present invention is what has the suck nozzles, the cassettes, and the cassette drive systems identical in arrangement pitch to allow a large number of electronic parts to be sucked simultaneously and mounted on a printed board, thereby eliminating unnecessary operations, resulting in improved total tact.

TABLE OF REFERENCE NUMBERS IN THE DRAWINGS

1—body
2—first supplying portion
3—second supplying portion
4—cassette
5—ball screw
6—table portion
8—guide rail
9—upper frame
10—first mounting head portion
10A—base member
11—second mounting head portion
12—first drive system
12A—first drive system
13—second rive system
14—drive motor
15—loader portion
16—unloader portion
18—suck nozzle 19—printed board
20—cylinder
20A—cylinder
20B—mount plate
21—lever
22—spool
23—pusher collar
23A—pusher collar
24—spool
25—spool
26—tape feed lever
27—feed claw mechanism
28—taping electronic parts
29—link member
50—electronic parts
70—electronic parts supplying portion
71—suck nozzle
72—mounting head portion
73—first drive shaft
74—second drive shaft
75—printed board
77—cassette
79—substrate holding portion
80—parts supplying portion
81—rotary head
82—such nozzle
83—X-Y table
85—printed board
86—recognition portion

What is claimed is:

1. An electronic parts mounting device comprising:

first and second supplying portions arranged at a given interval, each of said first and second supplying portions operatively associated with a plurality of cassettes arrayed adjacent each other for supplying electronic parts in sequence;

first and second drive mechanisms operatively associated with said first and second supplying portions, respectively, each of said first and second drive mechanisms including a plurality of cylinders arrayed adjacent each other for transporting the electronic parts in the cassettes to pickup stations in sequence;

a slidable table holding a printed board on which the electronic parts are to be mounted, said table disposed between said first and second supplying portions so as to be slidable along a first path; and first and second mounting heads each operatively associated with a plurality of suck nozzles arrayed adjacent each other, the suck nozzles being movable for sucking the electronic parts at the pickup stations and mounting the sucked electronic parts on the printed board on said slidable table, respectively, each of said first and second mounting heads being movable along a second path perpendicular to the first path, said second path extending across said table from the pickup stations for one of said first and second supplying portions to the pickup stations for the other of said first and second supplying portions, wherein the cassettes are arrayed adjacent each other at a first pitch, the cylinders are arrayed adjacent each other at a second pitch, and the suck nozzles are arrayed adjacent each other at a third pitch, said first pitch, said second pitch and said third pitch being substantially equal to each other.

2. An electronic parts mounting device as set forth in claim 1, wherein each of said first and second drive mechanisms is installed on an upper portion of one of said first and second supplying portions.

3. An electronic parts mounting device as set forth in claim 2, wherein each of the cylinders of said first and second drive mechanisms includes a plurality of spools connected in series, said spools moving in response to fluid pressures respectively acting thereon to transport the electronic parts to pickup stations.

4. An electronic parts mounting device as set forth in claim 1, wherein each of said first and second drive mechanisms is connected to one of said first and second mounting heads through a mount member so as to move in unison.

5. An electronic parts mounting device as set forth in claim 4, wherein each of the cylinders of said first and second drive mechanisms includes a plurality of spools connected in series, said spools moving in response to fluid pressures respectively acting thereon to transport the electronic parts to pickup stations.

\* \* \* \* \*

UNITED STATES PATENT AND TRADEMARK OFFICE
CERTIFICATE OF CORRECTION

PATENT NO. : 6,216,336 B1
DATED : April 17, 2001
INVENTOR(S) : Mitsushima et al.

It is certified that error appears in the above-identified patent and that said Letters Patent is hereby corrected as shown below:

REFERENCES CITED
FOREIGN PATENT DOCUMENTS

First foreign patent listed should read 61-264788 not 61-204700.

Signed and Sealed this

Twenty-eighth Day of August, 2001

*Attest:*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,216,336 B1
DATED : April 17, 2001
INVENTOR(S) : Takatoshi Mitsushima, Kunio Tanaka, Takashi Munezane It is certified that error appears in the above-identified patent and that said Letters Patent is hereby corrected as shown below:

<u>Title page,</u>
Item [54], ELECTRONIC PARTS MOUNTING DEVICE

Signed and Sealed this

Eleventh Day of December, 2001

*Attest:*

*Nicholas P. Godici*

*Attesting Officer*

NICHOLAS P. GODICI
*Acting Director of the United States Patent and Trademark Office*